United States Patent [19]

Kubala et al.

[11] Patent Number: 5,802,354
[45] Date of Patent: Sep. 1, 1998

[54] METHOD AND APPARATUS FOR SYNCHRONIZING SELECTED LOGICAL PARTITIONS OF A PARTITIONED INFORMATION HANDLING SYSTEM TO A TEST DATESOURCE

[75] Inventors: Jeffrey P. Kubala, Poughquag; Thomas B. Mathias, Vestal; Ira G. Siegel, New Paltz; David E. Whitney, Poughkeepsie, all of N.Y.

[73] Assignee: International Business Machines Corporation, Armonk, N.Y.

[21] Appl. No.: 871,429

[22] Filed: Jun. 9, 1997

[51] Int. Cl.[6] .................................................. G06F 1/12
[52] U.S. Cl. ........................................................ 395/551
[58] Field of Search ........................... 395/551, 555, 395/200.78

[56] References Cited

U.S. PATENT DOCUMENTS

| | | |
|---|---|---|
| 4,843,541 | 6/1989 | Bean et al. . |
| 5,410,655 | 4/1995 | Greenfield et al. . |
| 5,561,809 | 10/1996 | Elko et al. . |
| 5,564,040 | 10/1996 | Kubala . |
| 5,564,903 | 10/1996 | Eccles et al. . |
| 5,574,945 | 11/1996 | Elko et al. . |
| 5,636,373 | 6/1997 | Glendening et al. ............... 395/551 |

OTHER PUBLICATIONS

"Enterprise Systems Architecture/390 Principles of Operation" IBM Publication, SA22-7201-02, Dec. 1994.
"Processor Resource/Systems Manager Planning Guide" IBM Publication, GA22-7236-01, Sep. 1996.

Primary Examiner—Thomas M. Heckler
Attorney, Agent, or Firm—W. A. Kinnaman, Jr.

[57] ABSTRACT

A method and apparatus for synchronizing selected logical partitions of a partitioned information handling system to a test datesource. A system operator is presented with a display panel in which the operator may specify a set of test partitions and a test clock value. Each partition designated as a test partition is synchronized to the test clock value upon being newly activated, while production partitions are synchronized to a production clock value. The first test partition to be newly activated is synchronized to the test clock value by calculating the difference between the test clock value and a host clock value and storing the difference as an epoch offset for that partition. Each subsequently activated test partition is synchronized to the test clock value by copying the epoch offset of the previously activated test partition.

20 Claims, 4 Drawing Sheets

CHANGE LOGICAL PARTITION SYSPLEX TEST DATESOURCE

| PARTITION NAME | CURRENTLY SYNCHRONIZED TO SYSPLEX TEST DATESOURCE | SYNCHRONIZE TO SYSPLEX TEST DATESOURCE ON NEXT ACTIVATION OF PARTITION |
|---|---|---|
| PART0001 | NO | ☐ |
| PART0002 | NO | ☑ |
| PART0003 | NO | ☐ |
| PART0004 | NO | ☐ |
| PART0005 | NO | ☐ |
| PART0006 | YES | ☑ |
| PART0007 | YES | ☑ |
| PART0008 | YES | ☑ |
| PART0009 | YES | ☑ |
| PART0010 | NO | |
| PART0011 | NOT ACTIVATED | |
| PART0012 | NOT ACTIVATED | |
| PART0013 | NOT ACTIVATED | PROFILE UNDEFINED ☑ |
| PART0014 | NOT ACTIVATED | PROFILE UNDEFINED ☑ |
| PART0015 | NOT ACTIVATED | PROFILE UNDEFINED ☑ |

SYSPLEX TEST DATESOURCE STARTING VALUES
DATE [03] - [04] - [2000] MM-DD-YYYY
TIME [02] : [01] : [05]  HH:MM:SS

[SAVE] [RESET] [CANCEL] [HELP]

METHOD AND APPARATUS FOR SYNCHRONIZING SELECTED LOGICAL PARTITIONS OF A PARTITIONED INFORMATION HANDLING SYSTEM TO A TEST DATESOURCE

BACKGROUND OF THE INVENTION

1. Field of the Invention

This invention relates to a method and apparatus for synchronizing selected logical partitions of a partitioned information handling system to a test clock value while allowing production partitions in the same central processor complex to remain synchronized to a production clock value.

2. Description of the Related Art

The so-called year 2000 date problem has received much attention in the popular and trade press in recent years. Basically, this problem results from the fact that, in order to save storage space, many early software programs encoded four-digit date fields with the last two digits only, so that the year 1997, for example, would be encoded as the binary equivalent of 97 (with the century being assumed) rather than as the binary equivalent of 1997. Considerable effort has been expended in recent years in addressing the date problem in legacy software, usually by replacing two-digit year references with four-digit year references that fully capture century information. Because of the erratic nature of early source documentation, revising date formats is a time-consuming, error-prone activity. Software programs that have retrofitted to eliminate the year 2000 date problem must therefore be extensively tested to identify any residual date problems, often by using a test datesource to simulate a post-millennium environment.

One system platform that has been the focus of much year 2000 software retrofitting has been the IBM® System/390® (S/390®) platform, owing to the considerable amount of software that has been created over the years for that platform and its predecessors System/360™ and System/370™ (S/370™).

Many S/390 hardware machines operate in what is known as logically partitioned (LPAR) mode. Logically partitioned computer systems are well known in the art and are described in U.S. Pat. No. 4,564,903 (Guyette et al.), U.S. Pat. No. 4,843,541 (Bean et al.), and U.S. Pat. No. 5,564,040 (Kubala), incorporated herein by reference. Commercial embodiments of logically partitioned systems include IBM S/390 processors with the Processor Resource/Systems Managers (PR/SM™) feature and described, for example, in the IBM publication Processor Resource/Systems Manager Planning Guide, GA22-7236-00, September 1996, incorporated herein by reference.

Logical partitioning allows the establishment of a plurality of system images within a single physical central processor complex (CPC). Each system image is capable of operating as if it were a separate computer system. That is, each logical partition can be independently reset, initially loaded with an operating system that may be different for each logical partition, and operate with different software programs using different input/output (I/O) devices. Logical partitioning is in common use today because it provides its users with flexibility to change the number of logical partitions in use and the amount of physical system resources assigned to each partition, in some cases while the entire central processor complex continues to operate.

Because many S/390 hardware machines operate in a logically partitioned mode, it would be desirable to be able to perform year 2000 testing in a logically partitioned environment. Currently, in a partitioned S/390 central processor complex, each logical partition has its own logical partition clock together with an epoch offset indicating the difference between the logical partition clock and a host clock. This is described in the commonly owned application of B. A. Glendening et al., Ser. No. 08/168,281, filed Dec. 15, 1993, now U.S. Pat. No. 5,636,373, and incorporated herein by reference. By suitable setting of its epoch offset, a particular partition may be synchronized to a test clock value, e.g., for year 2000 testing, while the production partitions may be synchronized to an actual clock value.

While a single logical partition may thus be synchronized to a test clock value, currently an operator must use an entire central processor complex to do year 2000 testing of a multi-member "sysplex" (i.e., containing multiple logical partitions). This is done in one of two ways in S/390 environments. For a central processor complex that does not have an external time reference (ETR) attached, the operator sets the time-of-day (TOD) clock of an attached support element ahead, does a power-on reset into logically partitioned mode, and uses the simulated ETR support of each logical partition operating system (e.g., the SIMETRID support of OS/390 and MVS/ESA). For a central processor complex that does have a real external time reference, the external time reference is set ahead. Neither of these alternatives, however, provides an environment where a production system can operate alongside a multi-member test sysplex that has a different time/date.

SUMMARY OF THE INVENTION

The invention is directed to a method and apparatus for synchronizing selected logical partitions of a partitioned information handling system to a test datesource. In accordance with the invention, a system operator is presented with a display panel in which the operator may specify a set of test partitions making up a test sysplex, together with a starting test clock value, or datesource. The test clock value may be selected for year 2000 testing and may differ from the production clock value to which the non-test (production) partitions are synchronized. Each partition designated as a test partition is synchronized to the test clock upon its next activation, while production partitions are synchronized to a production clock as in a conventional configuration.

The first test partition to be newly activated is synchronized to the starting test clock value entered by the system operator. Each subsequently activated test partition, on the other hand, is synchronized to the current clock value of the previously activated test partition, which has meanwhile advanced from the starting value entered by the system operator. As a result, all of the test partitions are synchronized to a common test clock value, allowing them to interact as a true sysplex. In effect, the test partitions make up a virtual sysplex with a time and date other than that of the production sysplex.

DESCRIPTION OF THE PREFERRED EMBODIMENT

Introduction

Figure 1:
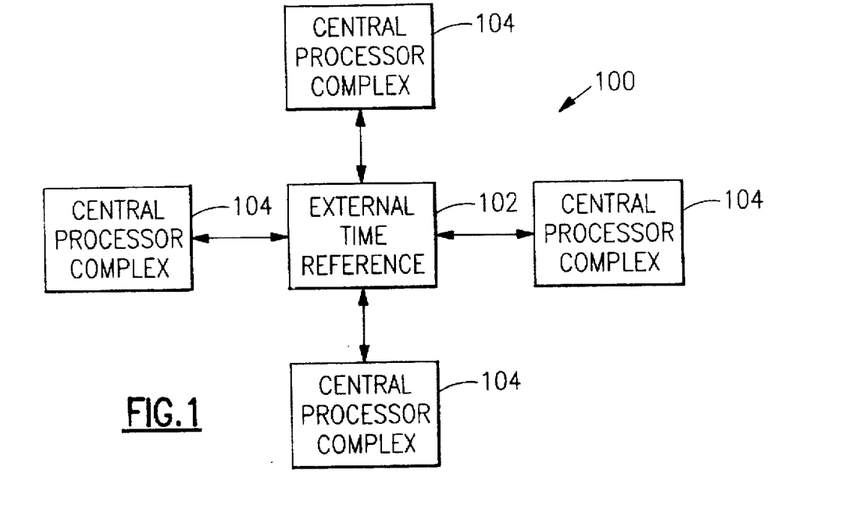
FIG. 1 is a schematic block diagram of a computer system complex incorporating the present invention.

Referring to FIG. 1, a computer system complex 100 incorporating the present invention may comprise an external time reference (ETR) 102 to which one or more central processor complexes (CPCs) or host systems 104 are attached. ETR 102 provides a common time-of-day (TOD) clock value to which CPCs 104 are synchronized. In an exemplary implementation of the invention in an IBM S/390 environment, ETR 102 may comprise an IBM Sysplex Timer®, while each CPC may comprise an IBM S/390 processor such as a Parallel Enterprise Server™.

In such an S/390 implementation, the TOD value comprises a 64-bit unsigned integer (where bit 0 is the most significant bit and bit 63 is the least significant bit) in which bit position 51 is incremented every microsecond (μs). A clock value of zero corresponds to Jan. 1, 1900, 0 a.m. Coordinated Universal Time (UTC). The S/390 TOD format and associated instructions such as Set Clock (SCK) and Store Clock (STCK) are fully described in the IBM Publication *Enterprise Systems Architecture/390 Principles of Operation*, SA22-7201-02, December 1994, incorporated herein by reference.

Figure 2:
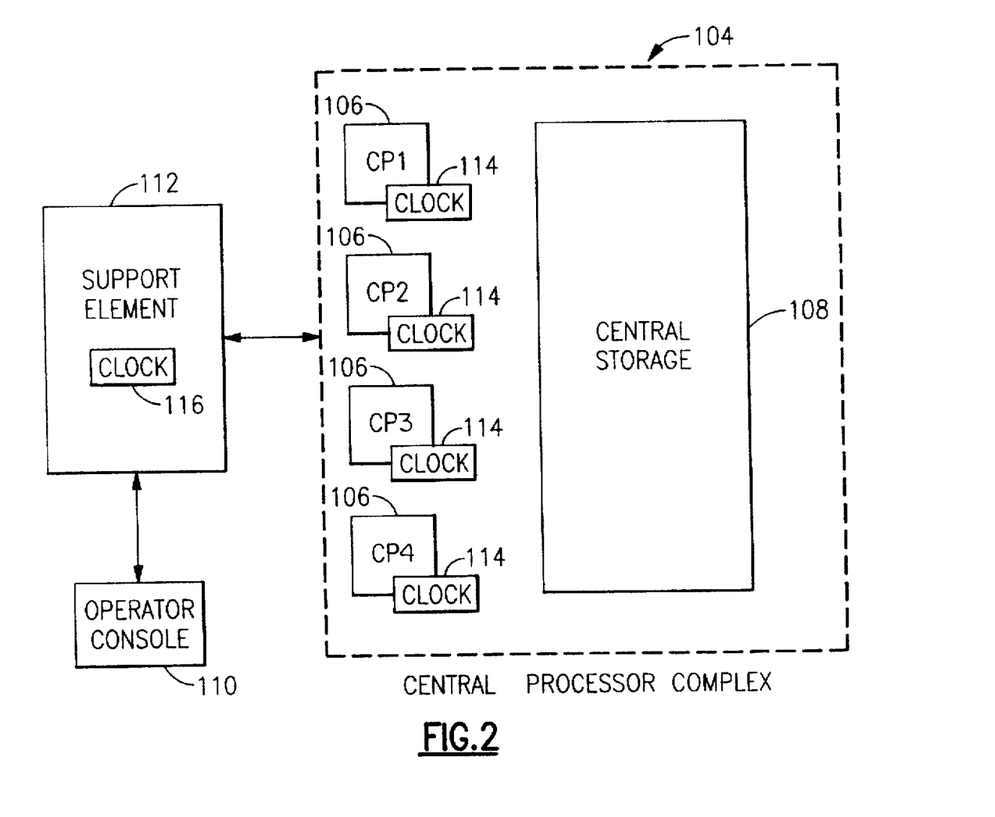
FIG. 2 is a schematic block diagram of a particular central processor complex of the system complex of FIG. 1, showing its principal hardware components.

Referring to FIG. 2, each central processor complex 104 contains one or more central processors (CPs) 106, an exemplary four of which (CP1–CP4) are shown, and central storage 108. Although not separately shown, central storage 108 may in turn comprise main storage accessible by programming and a hardware storage area (HSA) for storing microcode and the like.

A system console 110 is coupled to the central processor complex 104 via a support element (SE) 112. System console 110 may comprise either a non-programmable terminal or a programmable workstation (PWS) such as a personal computer. System console 110 is the point from which the system operator enters commands and otherwise interacts with the central processor complex 104 to which the support element 112 is attached. Although system console 110 and support element 112 are shown as separate elements, they may be physically and/or logically integrated if desired.

Each central processor 106 has its own TOD clock 114, while support element 112 has a TOD clock 116. TOD clocks 114, which may collectively be regarded as a "host clock", are automatically set during activation of CPC 104. The time reference used depends on whether or not an external time reference 102 is attached to the CPC 104. If an external time reference 102 is attached, the TOD clocks 114 are set to the TOD value of the external time reference. Otherwise, the TOD clocks 114 for each processor are set to the TOD value 116 of the support element 112.

As is conventional, central processor complex 104 is connected to user-accessible storage, comprising one or more direct access storage devices (DASD) such as magnetic disk drives, for permanent storage of the programs residing in the logical partitions to be described, as well as to other peripheral input/output (I/O) devices (not shown).

Figure 3:
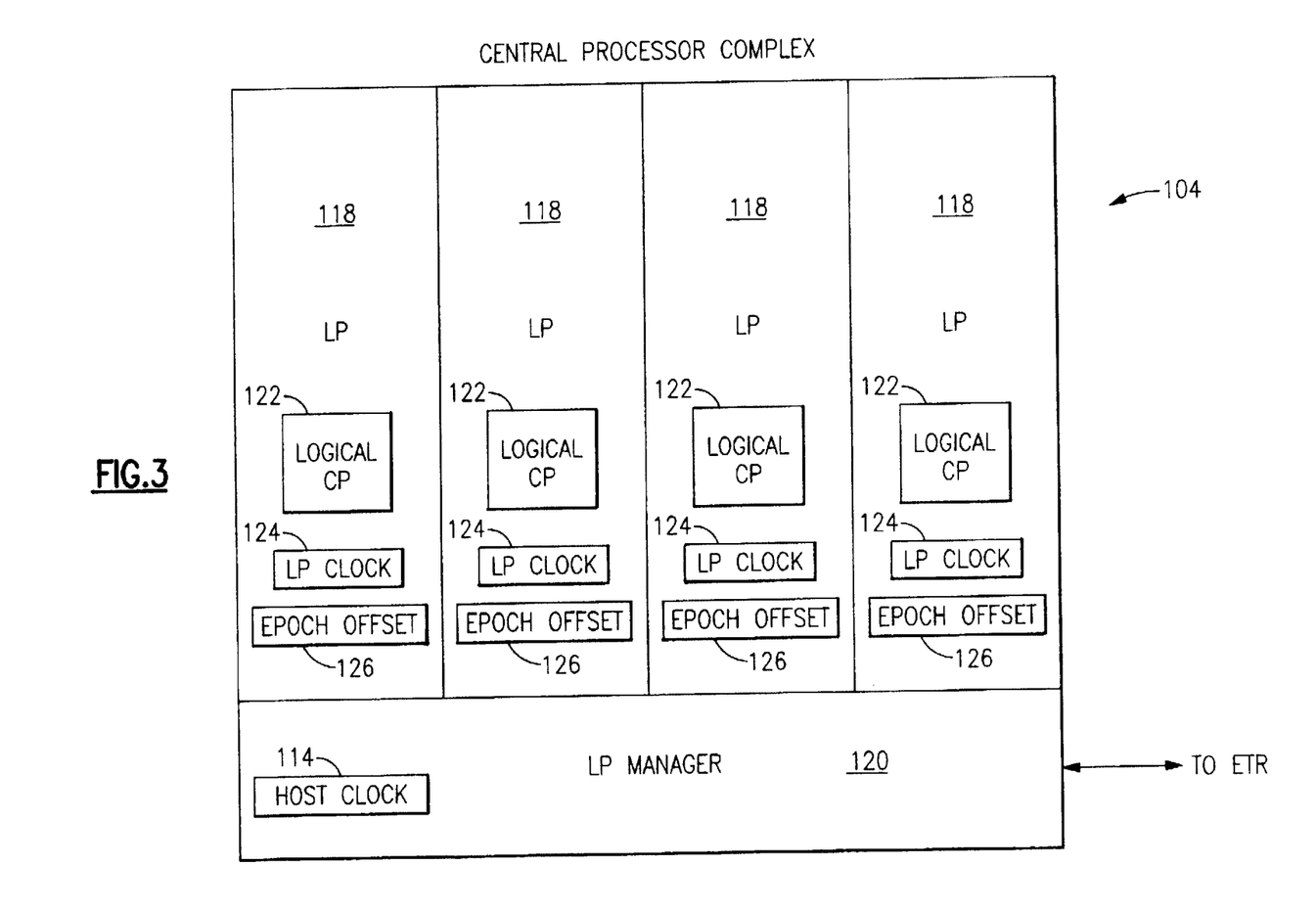
FIG. 3 is a schematic block diagram of the central processor complex of FIG. 2, showing its division into logical partitions.

Referring to FIG. 3, central processor complex 104 is divided into a plurality of logical partitions (LPs) 118, an exemplary four of which (LP1–LP4) are shown, which are managed by a logical partition manager 120. Logical partition manager 120 and logical partitions 118 each comprise one or more programs residing in respective portions of central storage 108. As noted above, from the standpoint of the resident programs, each logical partition 118 effectively functions as a separate hardware machine and is thus referred to herein as a separate "system". Each logical partition 118 has its own operating system (not separately shown), which may differ for each logical partition. Suitable such operating systems in an S/390 environment include the IBM programs OS/390™, MVS/ESA™, VM/ESA™, VSE/ESA™ and Transaction Processing Facility (TPF). Logical partitioning in an S/390 environment is discussed further in the references cited above.

Each logical partition 118 has one or more logical processors (logical CPs) 122, each of which represents all or a share of a physical processor 106 allocated to that logical partition. Associated with each logical processor 122 is a logical TOD clock 124. The logical TOD clocks 124 for the logical processors 122 of a particular logical partition 118 agree with one another, but may differ from the clocks 124 of other partitions or from the host clock 114. Collectively, the logical TOD clocks 124 of a particular logical partition 118 may be regarded as the "logical partition clock" for that partition.

Each logical partition 118 also has an epoch offset field 126 for storing the difference (epoch offset) between the logical partition clock 124 and the host clock 114. The epoch offset 126 is used as the basis for deriving the value of logical partition clock from that of the host clock 114 whenever the former is required, e.g. to execute a Store Clock instruction issued by the partition. Logical partition clock 124 is thus a derived clock obtained by arithmetically combining the host clock 114 and the epoch offset 126 whenever required to return a clock value to programming.

Conventional Logical Partition Synchronization

In the conventional operation of a logically partitioned S/390 CPC 104, as described, for example, in the IBM publication *Processor Resource/Systems Manager Planning Guide*, GA22-7236-00, September 1996, each logical partition 118 starts out with the value of the host clock 114 at the completion of logical partition activation. The operating system running in a particular logical partition 118 can set a TOD value for itself, by issuing a Set Clock (SCK) instruction, and this will be the only TOD reference it will see. Setting the TOD clock 124 for one logical processor 122 in the logical partition 118 sets the TOD clock 124 for all logical processors in that logical partition, but does not affect the logical processors in any other logical partition. The value of the logical partition clock 124 is used for the duration of the logical partition activation, or until a subsequent Set Clock (SCK) instruction is issued in the logical partition 118.

The operating system in each logical partition 118 can independently choose whether or not to synchronize to the external time reference 102 if one is present. Operating systems in logical partitions 118 that do synchronize to the external time reference 102 will all be running with identical TOD values. Operating systems in logical partitions 118 that do not synchronize to the external time reference 102 do not need to be aware of the presence of an external time reference and can set their TOD values independently of all other logical partitions.

Conventionally, year 2000 testing is possible in a single logical partition 118. An independent system with all data isolated from production systems can perform year 2000 testing in a logical partition 118 by setting the TOD clock in the test partition ahead of whatever is needed for the test.

Production partitions 118 can reside on the same CPC with current time and date settings. The production partitions 118 can use any attached external time reference if desired. The single independent system performing year 2000 testing can be a single-system (one logical partition) parallel sysplex (using ETRMODE=NO in the CLOCKxx parmlib member for OS/390 or MVS/ESA).

If year 2000 testing of a multi-member sysplex (i.e., one comprising multiple logical partitions 118) is desired, this can be done conventionally only by using the entire CPC 104 for this testing; all logical partitions 118 in the CPC 104 must use the year 2000 time reference. This is done by setting the support element clock 116 ahead for a CPC 104 that does not have an external time reference 102 attached, performing a power-on-reset into logically partitioned mode, and using the SIMETRID support of OS/390 and MVS/ESA. If a real external time reference 102 is used for this test, the external time reference must also be dedicated to this test.

Logical Partition Synchronization in Present Invention

In accordance with the present invention, the system operator is allowed to input a test clock value and designate a subset of the logical partitions 118 as test partitions. Partitions 118 designated as test partitions are synchronized to the test clock value when they are next activated, while the production partitions are synchronized to a production clock value indicative of the actual time, as they are conventionally. In effect, the central processor complex 104 is divided into a production sysplex comprising (potentially) interacting production partitions 118 and a test sysplex comprising (potentially) interacting test partitions.

Figure 4:
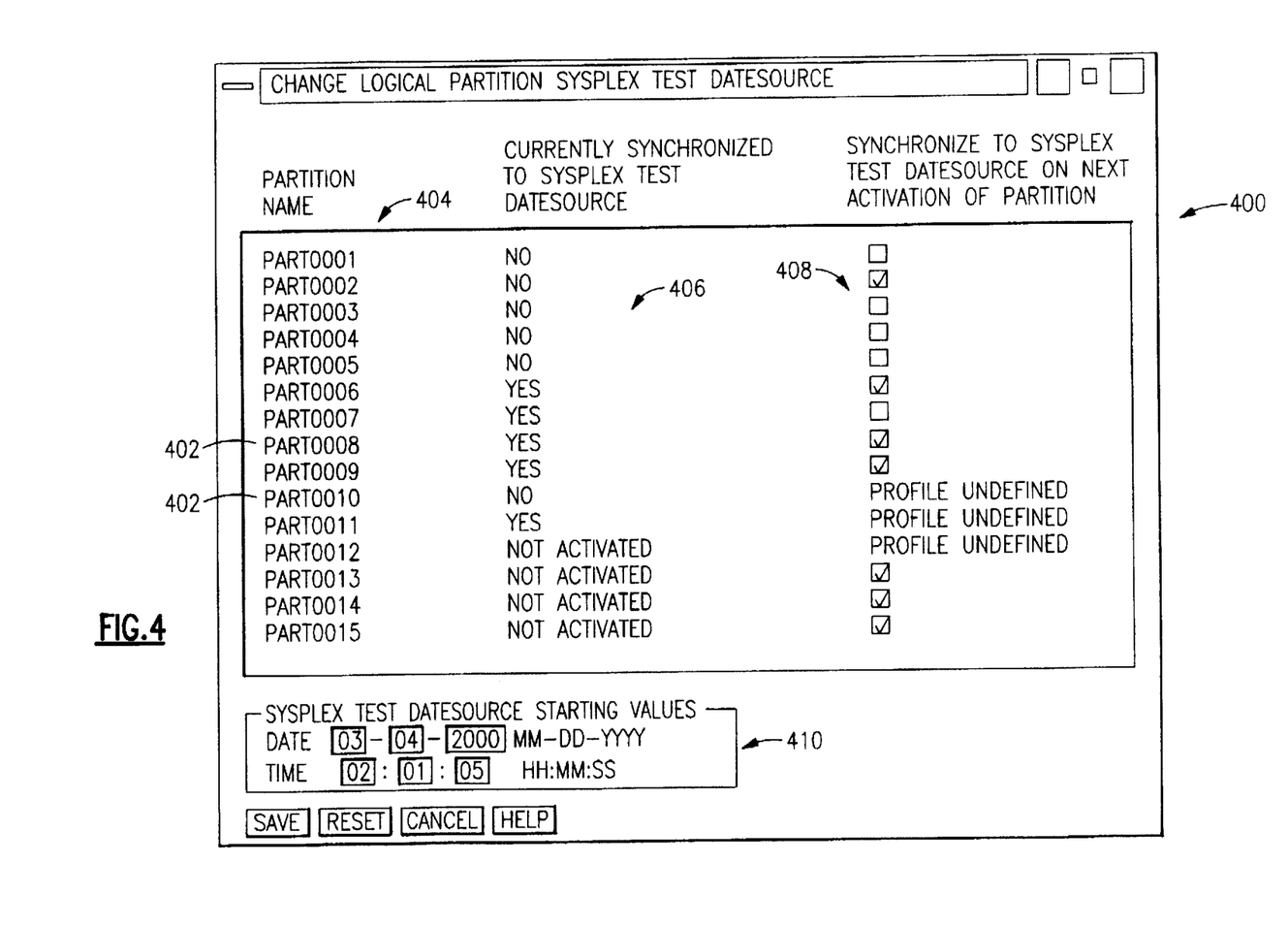
FIG. 4 shows a panel that is displayed to the operator of the system console shown in FIG. 2.

FIG. 4 shows a panel 400 that is generated by the support element 112 and displayed on system console 110 on being invoked by the system operator. Display panel 400 may be invoked by the system operator at any time, but the settings do not take effect until the partitions 118 are reactivated.

Display panel 400 contains a row 402 for each logical partition 118 of the central processor complex 104, with each row containing a first column 404 indicating the name of the logical partition 118 (PART0001, etc.), a second column 406 indicating whether the logical partition is currently synchronized to a test clock value ("datesource") and thus functioning as a test partition, and a third column 408 indicating whether the logical partition has been selected to become a test partition on its next activation. Display panel 400 also contains an area 410 for entering date and time components of a test clock value as well as various buttons for saving or cancelling entered values, getting help information and the like.

(The above description of panel 400 assumes that CPC 104 is in logically partitioned (LPAR) mode. If CPC 104 is not in logically partitioned mode, then only the date/time area 410 and the various buttons below that area are displayed.)

To enter a starting test clock value, the operator enters a date and time in the indicated format in the date and time area 410 of the display panel 400. Year values that are outside a valid range for the TOD clock in question (e.g., before 1900 or after 2041 in the Sysplex Timer date format) are disallowed. Optionally, a default test clock value (e.g., Jan. 1, 1000 at 00:00:00) may be assumed if an explicit value is not entered. To mark a logical partition 118 for synchronization to the test clock value as a test partition on its next activation, the operator checks the box in the third column 408 corresponding to the logical partition.

Figure 5:
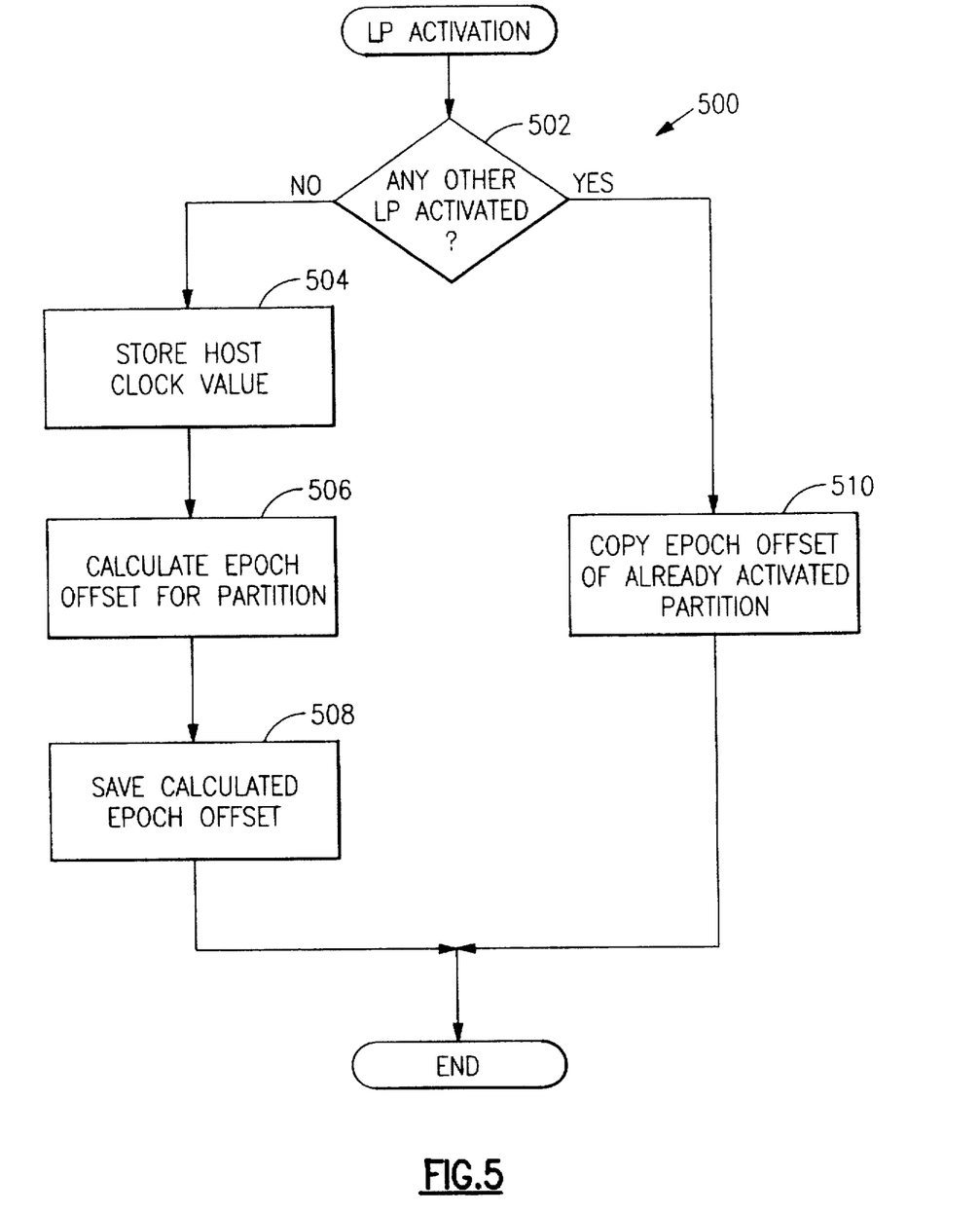
FIG. 5 shows the procedure followed when a test partition is newly activated.

Logical partition manager 120 ensures that the logical partitions 118 designated as test partitions are synchronized to the test clock value specified by the system operator. FIG. 5 shows the synchronization procedure 500 initiated by the logical partition manager 120 when a test partition 118 is newly activated.

When a test partition 118 is newly activated, procedure 500 first determines whether any other test partition 118 has already been activated (step 502). If no other test partition 118 has already been activated, then the procedure first reads the value of the host clock 114, e.g. by issuing a Store Clock (STCK) command in an S/390 environment (step 504). The procedure then calculates an epoch offset for the partition 118 as the difference between the starting test clock value as entered by the system operator and the host time as indicated by the host clock 114 (step 506). Finally, the procedure stores the calculated epoch offset in the epoch offset field 126 of the test partition 118 to complete the clock synchronization phase of partition activation (step 508).

If at step 502 another test partition 118 has already been activated, then the procedure 500 simply copies into the epoch offset field 122 of the newly activated partition the epoch offset stored in the field of the already activated test partition (step 510). From this epoch offset, a logical partition time can be readily derived by combining the host time as indicated by the host clock 114 with the epoch offset for that partition.

Logical partition manager 120 informs the operating system resident in each logical partition 118 during initial program load (IPL) of membership in the test sysplex. This may be done in an S/390 environment by setting a new variable in the results of a Read SCP Information SCLP, however the particular mechanism is unimportant. With this information provided by logical partition manager 120, the resident operating systems will ensure that synchronized test partitions are kept segregated (in their own sysplex) from production partitions that are not synchronized to the test clock value.

Any suitable means may be used to designate production partitions 118 and select clock values for those partitions. Thus, logical partitions 118 that are defined may be assumed to be production partitions unless explicitly designated as test partitions. Similarly, each logical partition clock 124 of a production partition 118 may by default be set equal to the host clock 114 (i.e., an epoch offset of zero).

Only those logical partitions 118 that are activated subsequent to the test sysplex definition are synchronized to the test clock value. Already activated partitions subsequently specified as members of the test sysplex must be reactivated to join the test sysplex.

If the test clock value is changed it will not be assumed by any of the specified logical partitions 118 until all logical partitions currently synchronized to the old test clock value have been deactivated. The first activation following that will assume the new clock value.

Other ways can be used to designate the members of a test sysplex besides the means indicated above. Thus, an activation profile for a particular logical partition 118 may be enhanced to indicate whether the partition is to be activated as a production partition or as a test partition.

The invention is preferably implemented as software or microcode (i.e., a machine-readable program of instructions tangibly embodied on a program storage devices) executing on one or more hardware machines. While a particular embodiment has been shown and described, various modifications will be apparent to those skilled in the art.

What is claimed is:

1. In an information handling system in which a single physical machine is divided into a plurality of logical partitions, each of which functions as a logical machine having access to specified resources of said physical machine, each of said logical partitions having a clock capable of being synchronized to an external time reference, a method of synchronizing selected ones of said logical partitions to a test clock value, comprising the steps of:

specifying a production clock value and a test clock value;

specifying a first subset of said logical partitions constituting production partitions;

specifying a second subset of said logical partitions constituting test partitions;

synchronizing said production partitions to said production clock value; and synchronizing said test partitions to said test clock value.

2. The method of claim 1 in which each of said clocks comprises a time-of-day (TOD) clock.

3. The method of claim 1 in which said step of specifying said clock values comprises the step of receiving input from a system operator specifying said test clock value.

4. The method of claim 1 in which said step of specifying said second subset of said logical partitions comprises the step of receiving input from a system operator specifying said test partitions.

5. The method of claim 1 in which each of said test partitions is synchronized to said test clock value upon being newly activated.

6. The method of claim 1 in which each of said test partitions is synchronized to said test clock value upon being newly activated by the steps of:

determining whether another test partition has been previously activated;

if no other test partition has been previously activated, synchronizing the clock of the newly activated logical partition to said test clock value;

if another test partition has been previously activated, synchronizing the clock of the newly activated logical partition to the clock of the previously activated test partition.

7. The method of claim 6 in which said physical machine has a host clock and each of said logical partitions has a logical partition clock and an epoch offset indicating the difference between said host clock and said logical partition clock, said step of synchronizing the clock of the newly activated logical partition to said test clock value comprising the step of:

if no other test partition has been previously activated, calculating an epoch offset for the newly activated partition as the difference between said host clock and said test clock value.

8. The method of claim 6 in which said physical machine has a host clock and each of said logical partitions has a logical partition clock and an epoch offset indicating the difference between said host clock and said logical partition clock, said step of synchronizing the clock of the newly activated logical partition to said test clock value comprising the steps of:

if another test partition has been previously activated, deriving the epoch offset for the newly activated partition from the epoch offset for the previously activated partition.

9. In an information handling system in which a single physical machine is divided into a plurality of logical partitions, each of which functions as a logical machine having access to specified resources of said physical machine, each of said logical partitions having a clock capable of being synchronized to an external time reference, apparatus for synchronizing selected ones of said logical partitions to a test clock value, comprising:

means for specifying a production clock value and a test clock value;

means for specifying a first subset of said logical partitions constituting production partitions;

means for specifying a second subset of said logical partitions constituting test partitions;

means for synchronizing said production partitions to said production clock value; and means for synchronizing said test partitions to said test clock value.

10. The apparatus of claim 9 in which said means for specifying said clock values comprises means for receiving input from a system operator specifying said test clock value.

11. The apparatus of claim 9 in which said means for specifying said second subset of said logical partitions comprises means for receiving input from a system operator specifying said test partitions.

12. The apparatus of claim 9 in which said second synchronizing means is operative when a test partition is newly activated and comprises:

means for determining whether another test partition has been previously activated;

means for synchronizing the clock of the newly activated logical partition to said test clock value if no other test partition has been previously activated;

means for synchronizing the clock of the newly activated logical partition to the clock of a previously activated test partition if another test partition has been previously activated.

13. The apparatus of claim 12 in which said physical machine has a host clock and each of said logical partitions has a logical partition clock and an epoch offset indicating the difference between said host clock and said logical partition clock, said means for synchronizing the clock of the newly activated logical partition to said test clock value if no other test partition has been previously activated comprising means for calculating an epoch offset for the newly activated partition as the difference between said host clock and said test clock value.

14. The apparatus of claim 12 in which said physical machine has a host clock and each of said logical partitions has a logical partition clock and an epoch offset indicating the difference between said host clock and said logical partition clock, said means for synchronizing the clock of the newly activated logical partition to the clock of a previously activated test partition if another test partition has been previously activated comprising means for deriving the epoch offset for the newly activated partition from the epoch offset for the previously activated partition.

15. A program storage device readable by a machine, tangibly embodying a program of instructions executable by the machine to perform method steps for synchronizing selected ones of a plurality of logical partitions to a test clock value in an information handling system in which a single physical machine is divided into a plurality of logical partitions, each of which functions as a logical machine having access to specified resources of said physical machine, each of said logical partitions having a clock capable of being synchronized to an external time reference, the method steps comprising:

specifying a production clock value and a test clock value;

specifying a first subset of said logical partitions constituting production partitions;

specifying a second subset of said logical partitions constituting test partitions;

synchronizing said production partitions to said production clock value; and synchronizing said test partitions to said test clock value.

16. The program storage device of claim 15 in which said step of specifying said clock values comprises the step of receiving input from a system operator specifying said test clock value.

17. The program storage device of claim 15 in which said step of specifying said second subset of said logical partitions comprises the step of receiving input from a system operator specifying said test partitions.

18. The program storage device of claim 15 in which each of said test partitions is synchronized to said test clock value upon being newly activated by the steps of:

determining whether another test partition has been previously activated;

synchronizing the clock of the newly activated logical partition to said test clock value if no other test partition has been previously activated;

synchronizing the clock of the newly activated logical partition to the clock of a previously activated test partition if another test partition has been previously activated.

19. The program storage device of claim 18 in which said physical machine has a host clock and each of said logical partitions has a logical partition clock and an epoch offset indicating the difference between said host clock and said logical partition clock, said step of synchronizing the clock of the newly activated logical partition to said test clock value if no other test partition has been previously activated comprising the step of:

calculating an epoch offset for the newly activated partition as the difference between said host clock and said test clock value.

20. The program storage device of claim 18 in which said physical machine has a host clock and each of said logical partitions has a logical partition clock and an epoch offset indicating the difference between said host clock and said logical partition clock, said step of synchronizing the clock of the newly activated logical partition to the clock of a previously activated test partition if another test partition has been previously activated comprising the step of:

deriving the epoch offset for the newly activated partition from the epoch offset for the previously activated partition.

* * * * *

UNITED STATES PATENT AND TRADEMARK OFFICE
CERTIFICATE OF CORRECTION

PATENT NO. : 5,802,354
DATED : September 1, 1998
INVENTOR(S) : Kubala et al.

It is certified that error appears in the above-identified patent and that said Letters Patent is hereby corrected as shown below:

Column 5, line 61, "1000" should be --2000--.

Signed and Sealed this

Fifth Day of October, 1999

Attest:

Q. TODD DICKINSON

*Attesting Officer*  *Acting Commissioner of Patents and Trademarks*